(12) United States Patent
Chen

(10) Patent No.: US 9,245,988 B2
(45) Date of Patent: Jan. 26, 2016

(54) ELECTROSTATIC DISCHARGE PROTECTION DEVICE AND ELECTRONIC APPARATUS THEREOF

(71) Applicant: ISSC TECHNOLOGIES CORP., Hsinchu (TW)

(72) Inventor: Che-Hong Chen, Hsinchu (TW)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 0 days.

(21) Appl. No.: 13/939,382

(22) Filed: Jul. 11, 2013

(65) Prior Publication Data
US 2014/0225159 A1     Aug. 14, 2014

(30) Foreign Application Priority Data
Feb. 8, 2013   (TW) ............................. 102105366 A

(51) Int. Cl.
*H01L 29/74* (2006.01)
*H01L 27/02* (2006.01)

(52) U.S. Cl.
CPC ............ *H01L 29/74* (2013.01); *H01L 27/0262* (2013.01)

(58) Field of Classification Search
CPC ............ H01L 27/0262; H01L 27/0255; H01L 27/0259; H01L 29/743; H01L 27/0251
See application file for complete search history.

(56) References Cited

U.S. PATENT DOCUMENTS

| | | | | |
|---|---|---|---|---|
| 5,898,193 | A * | 4/1999 | Ham ............................. | 257/173 |
| 7,786,507 | B2 * | 8/2010 | Denison et al. ............... | 257/173 |
| 2009/0034137 | A1 * | 2/2009 | Disney et al. .................... | 361/56 |
| 2012/0161216 | A1 * | 6/2012 | Liang et al. .................... | 257/296 |
| 2014/0167106 | A1 * | 6/2014 | Salcedo ........................ | 257/146 |

* cited by examiner

*Primary Examiner* — Hoai V Pham
*Assistant Examiner* — Long Le
(74) *Attorney, Agent, or Firm* — Slayden Grubert Beard PLLC

(57) ABSTRACT

An electrostatic discharge protection device has a substrate, a P-well, a N-well, and an isolation portion. The P-well and N-well formed in the substrate are neighboring to each other. Along a specific direction, the P-well has a first N-type, a first P-type, a second N-type, a second P-type, and a third N-type high doping regions sequentially located thereon, and the N-well has a third P-type, a fourth N-type, a fourth P-type, a fifth N-type, and a fifth P-type high doping regions sequentially located thereon. The first N-type, the third N-type, the first P-type, and the second P-type high doping regions are coupled to a ground end, the third P-type, the fifth P-type, the fourth N-type, and the fifth N-type high doping regions are coupled to a voltage supply end, and the second N-type and the fourth P type high doping regions are coupled to an input/output end.

11 Claims, 17 Drawing Sheets

ELECTROSTATIC DISCHARGE PROTECTION DEVICE AND ELECTRONIC APPARATUS THEREOF

BACKGROUND

1. Technical Field

The present disclosure relates to an electrostatic discharge protection device, in particular, to an electrostatic discharge protection device with embedded silicon controlled rectifier (SCR) and an electronic device thereof.

2. Description of Related Art

To protect electronic elements (e.g. integrated circuit) from encountering electrostatic discharge and being damaged during the design, production, and use processes. Thus, there is usually an electrostatic discharge protection circuit set on the path connected to the bonding wire in the electronic device to protect the inner circuit of the electronic device.

Please refer to FIG. 1, FIG. 1 is a circuit diagram of an electronic device with a traditional electrostatic discharge protection device. As shown in FIG. 1, the electronic device comprises an input/output end 2', a supply voltage end VDD, a ground end GND, and an electrostatic protection device and chip 6', wherein the electrostatic protection device consists of the diode 3', 4' and an plug-in clamp circuit 5' (consisted of a plurality of transistors and a resistor for instance).

An anode of the diode 3' and a cathode of the diode 4' are connected to the input/output end 2'. A cathode of the diode 3' is connected to the supply voltage end VDD and an anode of the diode 4' is connected to the ground end GND. The clamping circuit 5' is connected between the supply voltage end VDD and the ground end GND. The chip 6' is connected to the supply voltage end VDD, the input/output end 2' and the ground end GND. The chip 6' is equivalent to the combination of multiple transistors; for instance, one of the transistors 7' is connected to the input/output end 2' and the ground end GND. The ground end GND is connected to a ground voltage, and the supply voltage end VDD is connected to a supply voltage, wherein the supply voltage is larger than the ground voltage.

When the input/output end 2' encounters the electrostatic discharge (positive voltage), there will be electrostatic discharge conducting path, path1, and more details will be explained in the following. In the electrostatic discharge conducting path, path1, the electrostatic discharge current will pass through the forward diode 2' to the voltage supply end VDD. Then, the electrostatic discharge current passes through the triggered clamping circuit 5' to the ground end GND. At that moment, the voltage of the input/output end 2' is $V_{th}+I_{path1}(R_{VDD}+R_{CLAMP})$, wherein $V_{th}$ is the forward conducting voltage of the diode 3', $I_{path1}$ is the electrostatic discharge current of the electrostatic discharge conducting path, path1. Furthermore, $R_{VDD}$ and $R_{CLAMP}$ are respectively the resistor of the wire connected to the voltage supply end and the resistor of the clamping circuit 5'. Thus, if the length of the wire connected to the voltage supply end is too long (i.e. $R_{VDD}$ is too large), the voltage of the input/output end 2' may be large, so that the chip 6' will be damaged; for instance, the transistor 7' will breakdown and be damaged.

SUMMARY

According to one exemplary embodiment of the present disclosure, the present disclosure provides an electrostatic discharge protection device. The mentioned electrostatic discharge protection device comprises a substrate, a P-well, a N-well, and an isolation portion. The P-well is formed in the substrate. Along a specific direction, the P-well has a first N-type, a first P-type, a second N-type, a second P-type, and a third N-type high doping regions sequentially located thereon, wherein, the first, third N-type high doping regions and the first, second P-type doping regions are connected to the ground end. The N-well formed in the substrate is neighboring to the P-well. Along a specific direction, the N-well has a third P-type, a fourth N-type, a fourth P-type region, a fifth N-type, and a fifth P-type high doping regions sequentially located thereon, wherein the third, fifth P-type high doping regions and the fourth, fifth N-type high doping regions are coupled to the voltage supply end, and the second N-type and fourth P-type high doping regions are coupled to the input/output end. The isolation portion is located between the third N-type and third P-type high doping regions.

One exemplary embodiment of the present disclosure provides an electronic device. The mentioned electronic device comprises the chip and the above mentioned electrostatic discharge protection device, wherein the electrostatic discharge protection device is coupled to the chip.

The exemplary embodiment of the present disclosure adopts the special layout structure, so that the electrostatic discharge protection device has embedded clamping circuit to form the silicon controlled rectifier path. The mentioned embedded clamping circuit can effectively control the voltage of the input/output end coupled to the electrostatic discharge protection device, thus preventing the problem of breakdown of the inner chip caused by the high voltage of the input/output end. In brief, being different from the traditional electrostatic discharge protection device, the electrostatic discharge protection device provided by the exemplary embodiment of the present disclosure does not need an extra plug-in clamping circuit to reach the effect of electrostatic discharge protection. The electrostatic discharge protection device provided by the exemplary embodiment of the present disclosure can also lower the voltage of the input/output end during the electrostatic discharge to protect the chip of the electronic device from breakdown due to the high voltage of the input/output end.

In order to further understand the techniques, means and effects of the present disclosure, the following detailed descriptions and appended drawings are hereby referred, such that, through which, the purposes, features and aspects of the present disclosure can be thoroughly and concretely appreciated; however, the appended drawings are merely provided for reference and illustration, without any intention to be used for limiting the present disclosure.

BRIEF DESCRIPTION OF THE DRAWINGS

The accompanying drawings are included to provide a further understanding of the present disclosure, and are incorporated in and constitute a part of this specification. The drawings illustrate exemplary embodiments of the present disclosure and, together with the description, serve to explain the principles of the present disclosure.

DESCRIPTION OF THE EXEMPLARY EMBODIMENTS

Figure 1:
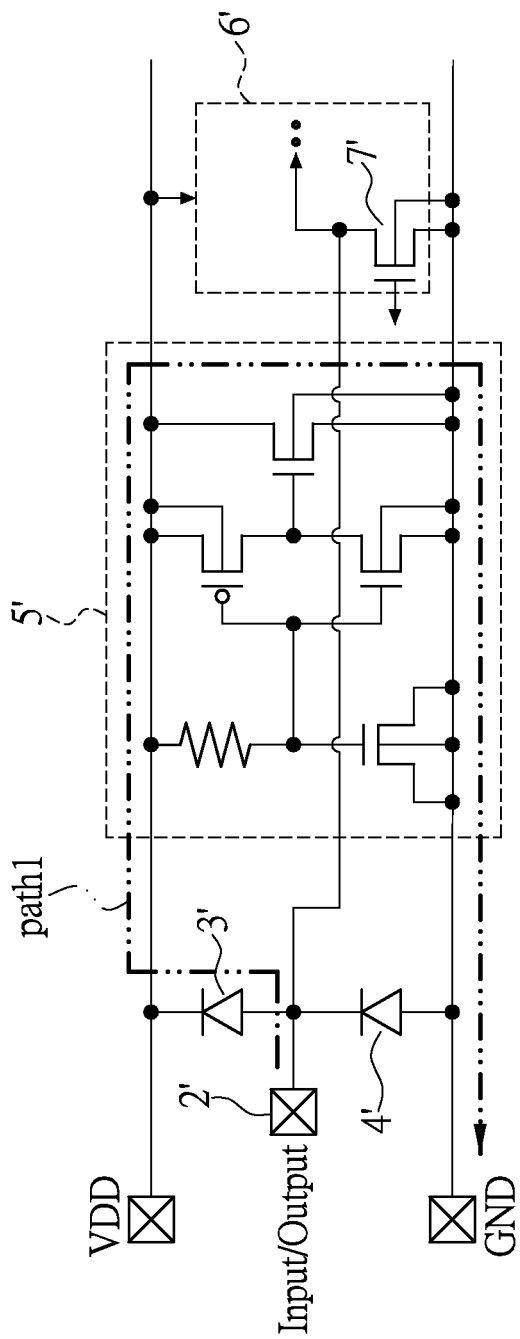
FIG. 1 is a circuit diagram of an electronic device with a traditional electrostatic discharge protection device.

Reference will now be made in detail to the exemplary embodiments of the present disclosure, examples of which are illustrated in the accompanying drawings. Wherever possible, the same reference numbers are used in the drawings and the description to refer to the same or like parts.

[ One Exemplary Embodiment of the Electrostatic Discharge Protection Device ]

The electrostatic discharge protection device of the exemplary embodiment of the present disclosure adopts the special layout structure to generate an embedded clamping circuit (or parasitic clamping circuit) near each input/output end. The embedded circuit is a silicon controlled rectifier, so it can effectively control the voltage of the input/output end to avoid the problem of the damage of the inner chip due to the high voltage of the input/output end.

Figure 2:
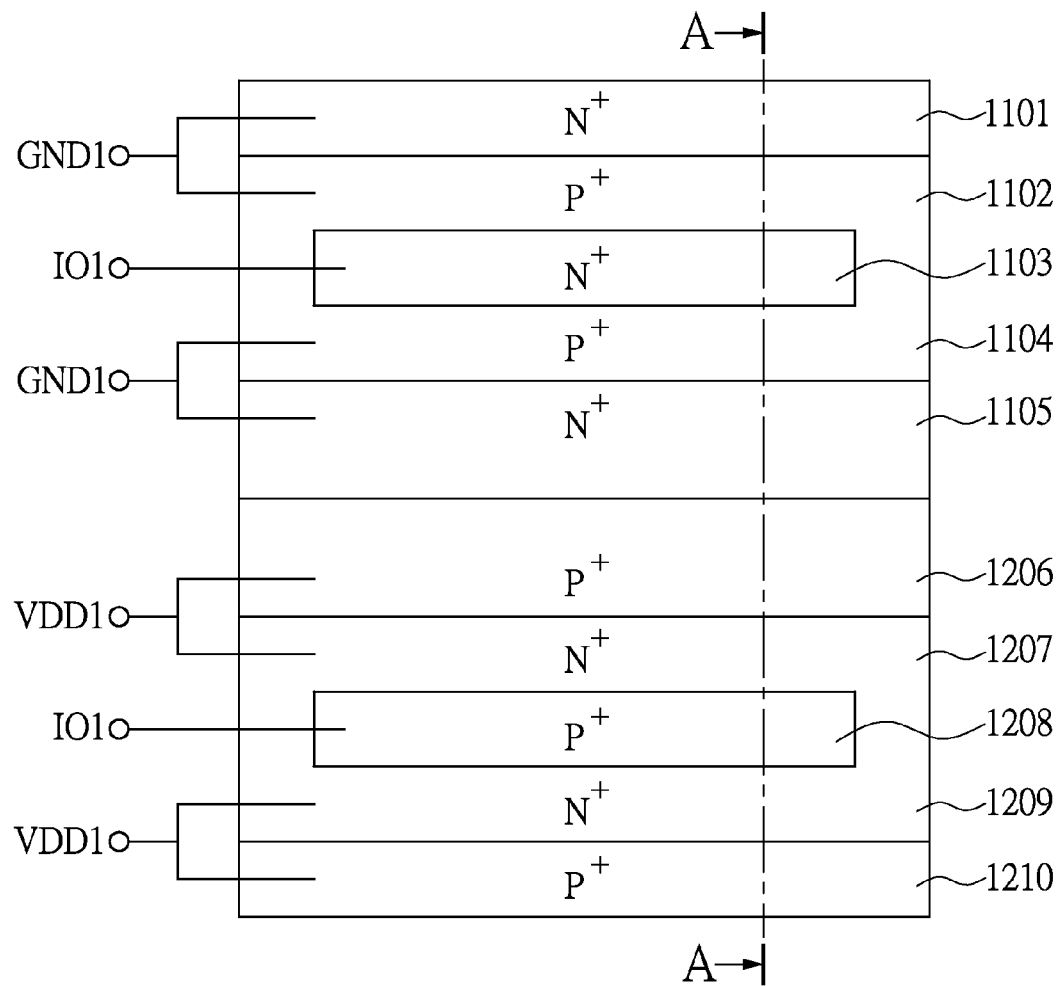
FIG. 2 is a layout diagram of an electrostatic discharge protection device according to an exemplary embodiment of the present disclosure.
Figure 3:
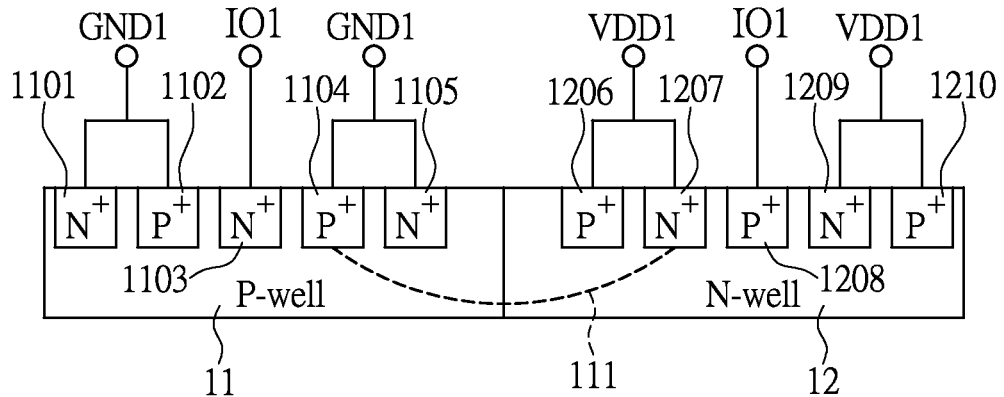
FIG. 3 is a cross-sectional diagram along the line AA of an electrostatic discharge protection device according to an exemplary embodiment of the present disclosure.
Figure 4:
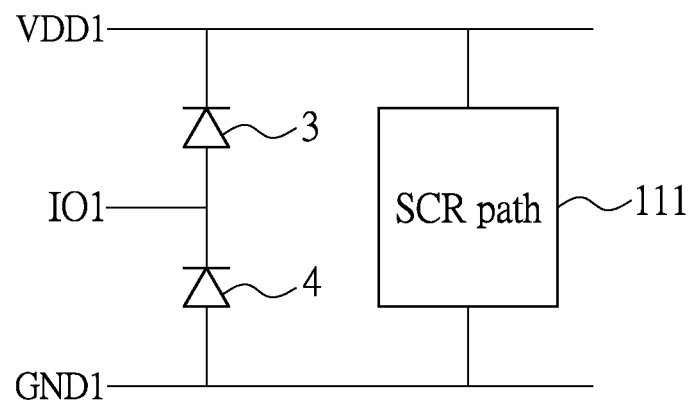
FIG. 4 is a circuit diagram of an electrostatic discharge protection device according to an exemplary embodiment of the present disclosure.

To further understand the exemplary embodiment of the present disclosure, please refer to FIG. 2, FIG. 3, and FIG. 4. FIG. 2 is a layout diagram of an electrostatic discharge protection device according to an exemplary embodiment of the present disclosure. FIG. 3 is a cross-sectional diagram along the line AA of an electrostatic discharge protection device according to an exemplary embodiment of the present disclosure. FIG. 4 is a circuit diagram of an electrostatic discharge protection device according to an exemplary embodiment of the present disclosure.

As shown in FIG. 2 and FIG. 3, the electrostatic discharge protection device according to the exemplary embodiment of the present disclosure comprises a substrate (not shown in the drawings), a P-well 11, a N-well 12, and an isolation portion 101. The P-well 11 and N-well 12 formed in the substrate are neighboring to each other. Along the vertical direction (as the direction of the line AA), the P-well 11 has a N-type high doping region 1101, P-type high doping region 1102, N-type high doping region 1103, P-type high doping region 1104, and N-type high doping region 1105 sequentially located thereon. Along the vertical direction, the N-well 12 has P-type high doping region 1206, N-type high doping region 1207, P-type high doping region 1208, N-type high doping region 1209, and P-type high doping region 1210 sequentially located thereon.

Please refer to FIG. 2 and FIG. 3 again, the N-type high doping regions 1101, 1105, and the P-type high doping regions 1102, 1104 are coupled to the ground end GND1, and the ground end GND1 is coupled to the first low reference voltage (e.g., the first ground voltage). The P-type high doping regions 1206, 1210, and the N-type high doping regions 1207, 1209 are coupled to the voltage supply end VDD1, and the voltage supply end VDD1 is coupled to the first high reference voltage (e.g., the first supply voltage). The N-type high doping region 1103 and the P-type high doping region 1208 are coupled to the input/output end IO1, and the input/output end IO1 is coupled to the first input/output voltage.

The silicon controlled rectifier path 111 is formed between the P-type high doping region 1104 and the N-type high doping region 1207. The silicon controlled rectifier path 111 is the embedded clamping circuit of the electrostatic discharge protection circuit. When the input/output end IO1 encounters electrostatic discharge (positive voltage), the silicon controlled rectifier path 111 provides a low-resistance path to lower the voltage of the input/output end IO1 during electrostatic discharge and avoid the inner chip of the electronic device from damage.

Furthermore, as shown in FIG. 2, the P-type high doping regions 1102 and 1104 can form a ring-shaped P-type high doping region, and the ring-shaped P-type high doping region encircles the N-type high doping region 1103, but the present disclosure is not limited thereto. Additionally, the N-type high doping regions 1207 and 1209 can also form a ring-shaped N-type high doping region, and the ring-shaped N-type high doping region encircles the P-type high doping region 1208, but the present disclosure is not limited thereto.

As shown in FIG. 4, the circuit of the structure of the electrostatic discharge protection device according to the exemplary embodiment of the present disclosure comprises the diodes 3, 4 and the silicon controlled rectifier path 111, wherein the anode of the diode 3 and the cathode of the diode 4 are coupled to the input/output end IO1. The cathode of the diode 3 and the anode of the diode 4 are respectively coupled to the voltage supply end VDD1 and the ground end GND1, and the two ends of the silicon controlled rectifier path 111 are respectively coupled to the voltage supply end VDD1 and the ground end GND1. Due to the embedded clamping circuit of the electrostatic discharge protection device according to the exemplary embodiment of the present disclosure, the electrostatic discharge protection device does not need an extra plugs-in clamping circuit, and the costs thereof is reduced. Furthermore, the electrostatic discharge protection device according to the exemplary embodiment of the present disclosure not only offers electrostatic discharge protection but also lower the voltage of the input/output end IO1 during electrostatic discharge. Thus, it can protect the inner chip of the electronic device from damage.

[Another Exemplary Embodiment of the Electrostatic Discharge Protection Device]

Figure 5:
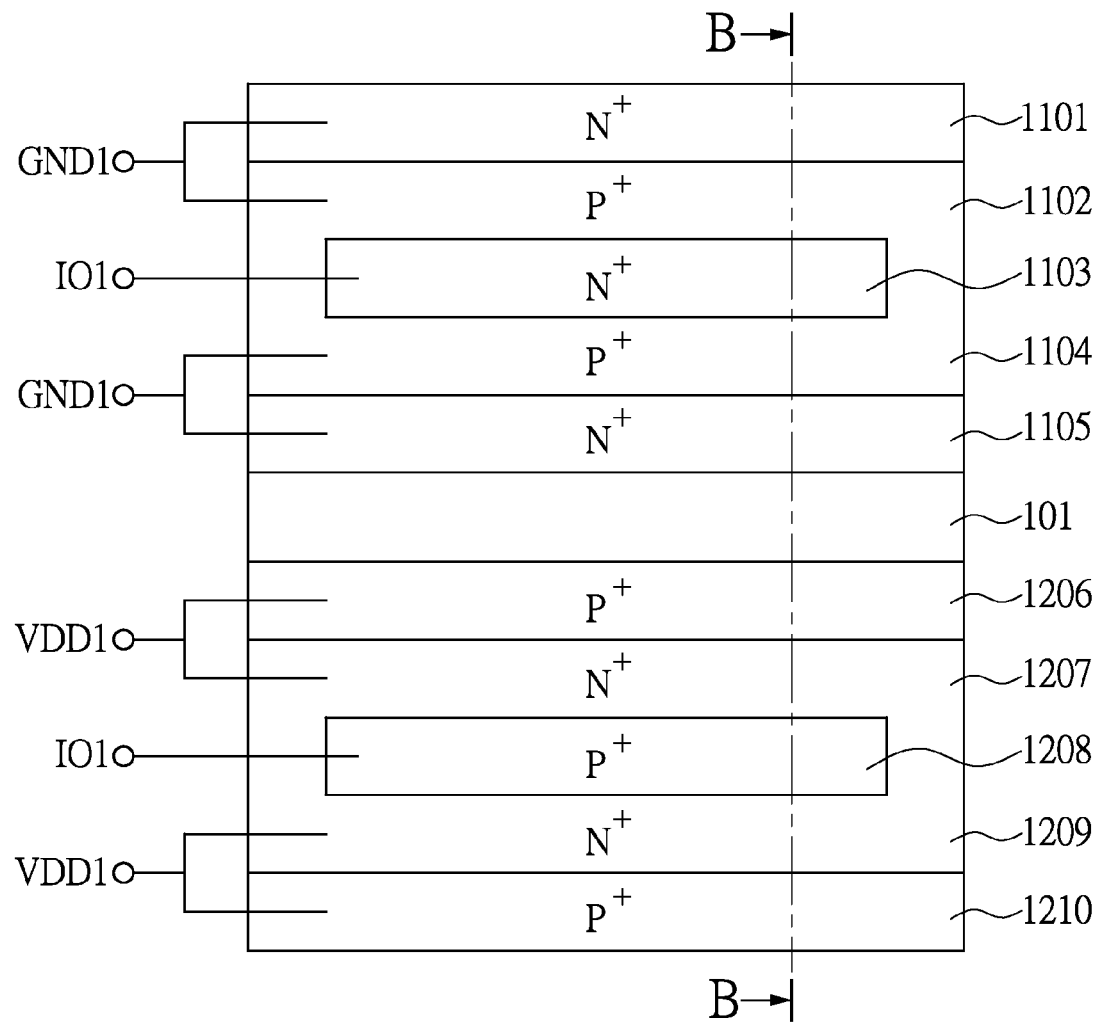
FIG. 5 is a layout diagram of an electrostatic discharge protection device according to another exemplary embodiment of the present disclosure.
Figure 6:
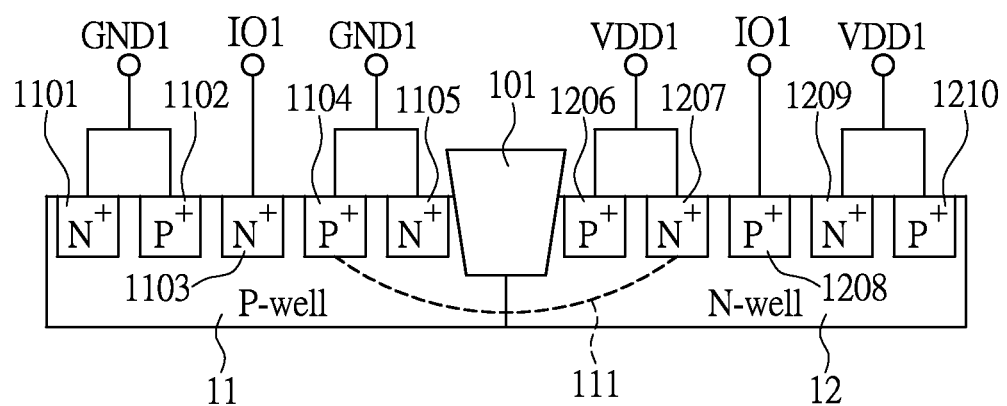
FIG. 6 is a cross-sectional diagram along the line BB of an electrostatic discharge protection device according to another exemplary embodiment of the present disclosure.

The following is another exemplary embodiment of the present disclosure, please refer to FIG. 5, and FIG. 6 to better understand the present disclosure. FIG. 5 is a layout diagram of an electrostatic discharge protection device according to another exemplary embodiment of the present disclosure, and FIG. 6 is a cross-sectional diagram along the line BB of an electrostatic discharge protection device according to another exemplary embodiment of the present disclosure. The basic working principles of the exemplary embodiment are similar to those of FIG. 2 and FIG. 3. The following only explains the differences between the present exemplary embodiment and the exemplary embodiment of FIG. 2 and FIG. 3.

Being different from the electrostatic discharge protection device of FIG. 2 and FIG. 3, the electrostatic discharge protection device in the exemplary embodiment of FIG. 5 and FIG. 6 comprises an isolation portion 101 formed between the N-type high doping region 1105 and the P-type high doping region 1206 to let the silicon controlled rectifier path 111 be formed between the P-type high doping region 1104 and the N-type high doping region 1207, but the present disclosure is not limited thereto. The silicon controlled rectifier path 111 is the embedded clamping circuit of the electrostatic discharge protection device, when the input/output end IO1 encounters electrostatic discharge (positive voltage), the silicon controlled rectifier path 111 provides a low-resistance path to lower the voltage of the input/output end 101 during the electrostatic discharge to avoid the inner chip of the electronic device from damage.

Furthermore, in the exemplary embodiment, the isolation portion 101 is formed in the N-well 11 and P-well 12 to form an embedded Lateral silicon controlled rectifier (LSCR), but the present disclosure is not limited thereto. In addition, the isolation portion 101 is the strip-shaped insulation portion to absolutely isolate the N-type high doping region 1105 and the P-type high doping region 1206, but the present disclosure is not limited thereto.

That is to say, the electrostatic discharge protection device of the present disclosure can selectively comprises the isolation portion, the following exemplary embodiment only takes the electrostatic discharge protection device with the isolation portion as the example, but the present disclosure is not limited thereto.

[Another Exemplary Embodiment of the Electrostatic Discharge Protection Device]

Figure 7:
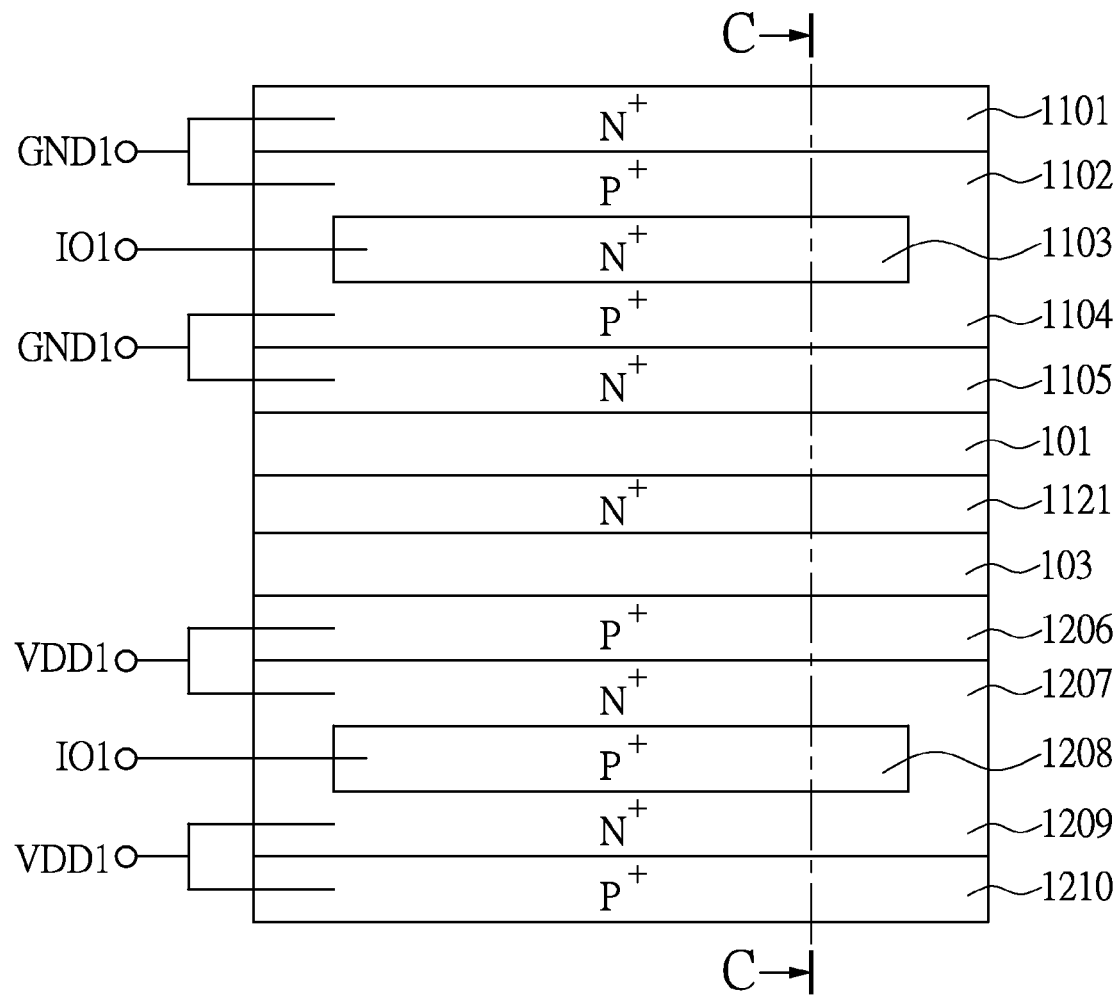
FIG. 7 is a layout diagram of an electrostatic discharge protection device according to another exemplary embodiment of the present disclosure.
Figure 8:
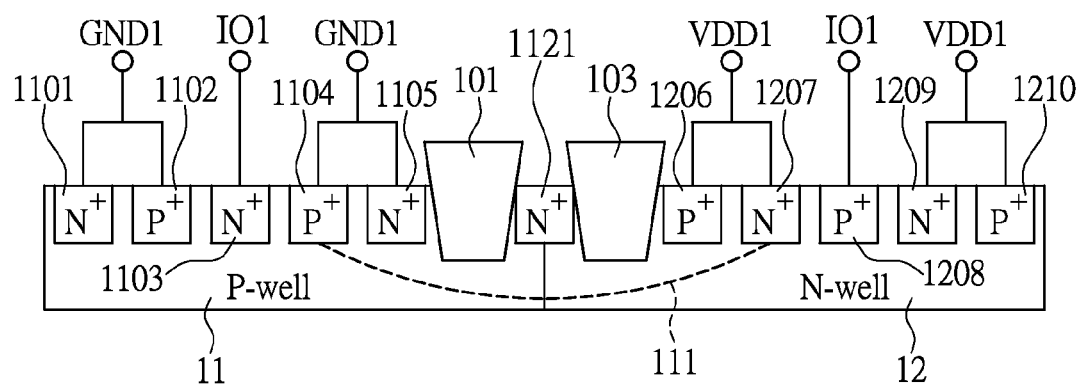
FIG. 8 is a cross-sectional diagram along the line CC of an electrostatic discharge protection device according to another exemplary embodiment of the present disclosure.

The following is another exemplary embodiment of the present disclosure, please refer to FIG. 7 and FIG. 8 to further understand the exemplary embodiment of the present disclosure. FIG. 7 is a layout diagram of an electrostatic discharge protection device according to another exemplary embodiment of the present disclosure, an FIG. 8 is a cross-sectional diagram along the line CC of an electrostatic discharge protection device according to another exemplary embodiment of the present disclosure. The basic working principles of the exemplary embodiment are similar to those of FIG. 5 and FIG. 6. The following only explains the differences between the present exemplary embodiment and the exemplary embodiment of FIG. 5 and FIG. 6.

Being different from the embedded lateral silicon controlled rectifier of the electrostatic discharge protection device of FIG. 5 and FIG. 6, the electrostatic protection device in the exemplary embodiment of FIG. 7 and FIG. 8 has embedded Modified Lateral SCR (MLSCR), but the present disclosure is not limited thereto. Thus, the electrostatic discharge protection device of FIG. 7 and FIG. 8 further comprises the isolation portion 103 and an N-type high doping region 1121, wherein the isolation portion 103 is also formed between the N-type high doping region 1105 and the P-type high doping region 1206. The isolation portions 101 and 103 are respectively formed in the P-well 11 and N-well 12. Furthermore, the N-type high doping region 1121 is formed in the P-well 11 and the N-well 12 and between the isolation portions 101 and 103.

Besides, in the present exemplary embodiment, the isolation portion 101 is the strip-shaped insulation portion to absolutely isolate the N-type high doping region 1105 and 1112. Besides, the isolation portion 103 is the strip-shaped insulation portion to absolutely isolate the N-type high doping region 1121 and the P-type high doping region 1206. However, present disclosure is not limited thereto.

In brief, the type of the embedded silicon controlled rectifier of the electrostatic discharge protection device is not used to limit the present disclosure. In another exemplary embodiment, the embedded silicon controlled rectifier of the electrostatic discharge protection device can also be embedded triggered silicon controlled rectifier, and correspondingly, there are other isolation portions or high doping regions formed between the N-type high doping region 1105 and the P-type high doping region 1206.

[Another Exemplary Embodiment of the Electrostatic Discharge Protection Device]

Figure 9:
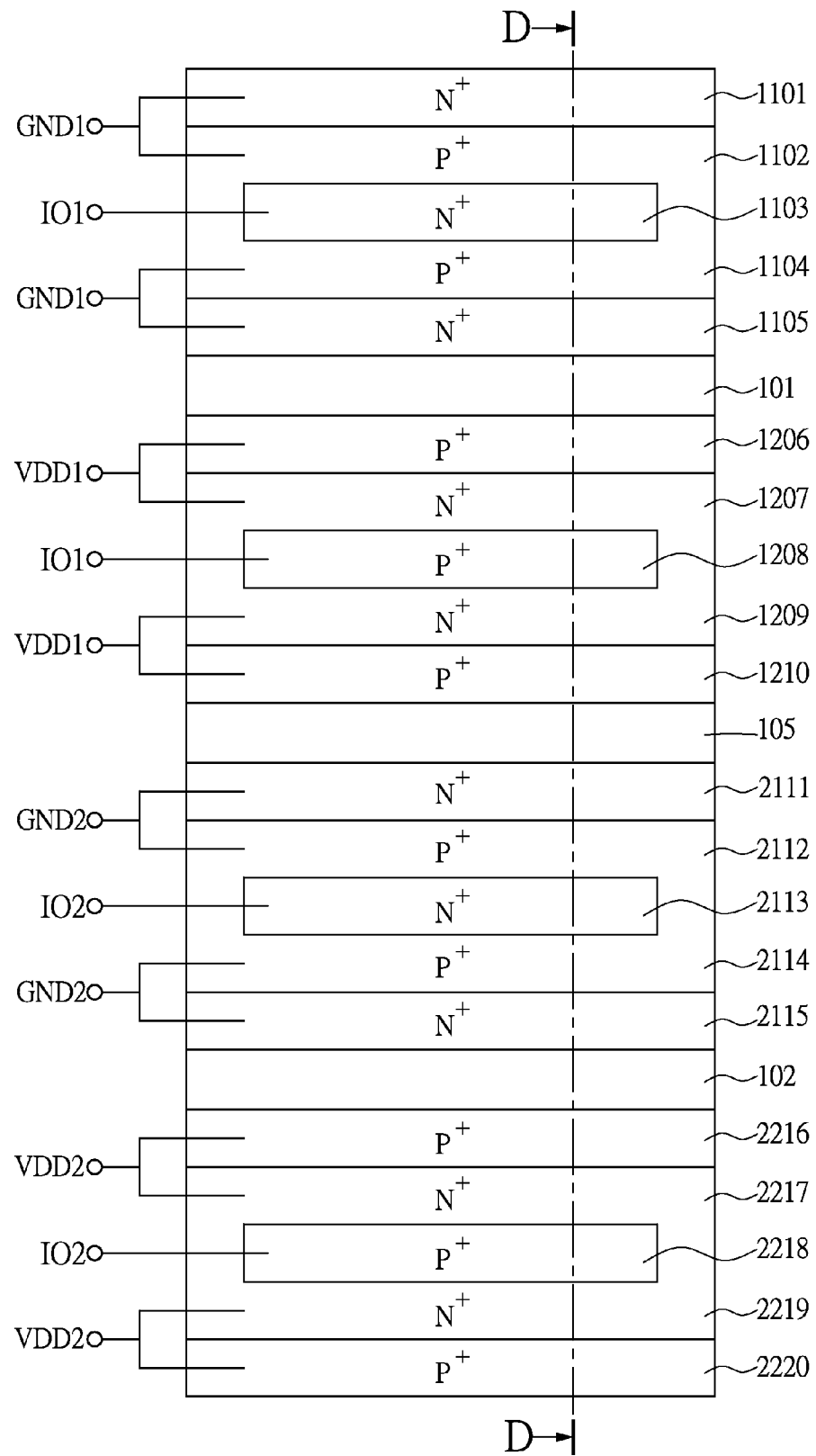
FIG. 9 is a layout diagram of an electrostatic discharge protection device according to another exemplary embodiment of the present disclosure.
Figure 10:
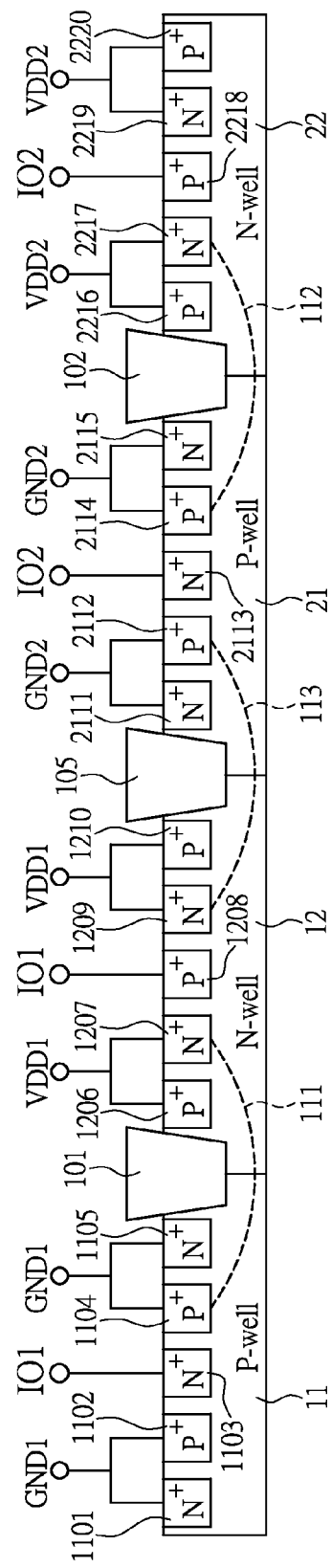
FIG. 10 is a cross-sectional diagram along the line DD of an electrostatic discharge protection device according to another exemplary embodiment of the present disclosure.
Figure 11:
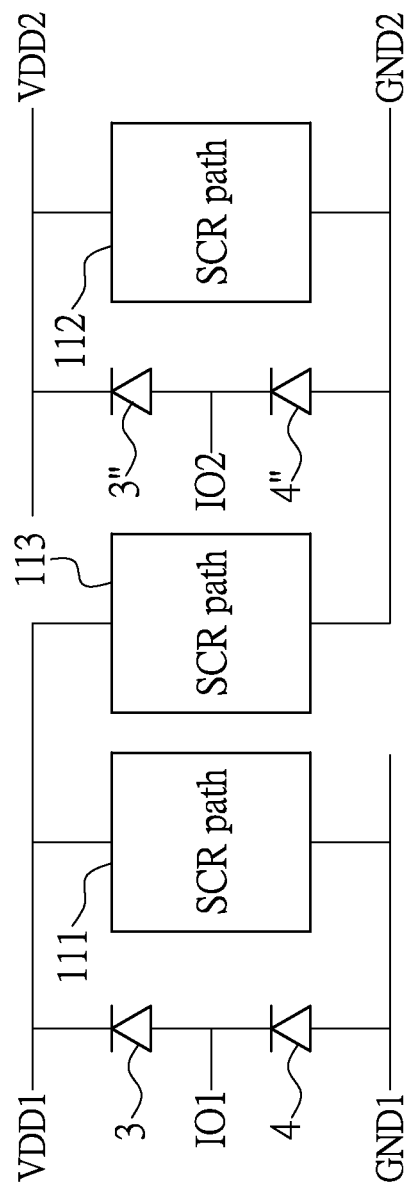
FIG. 11 is a circuit diagram of an electrostatic discharge protection device according to another exemplary embodiment of the present disclosure.

To further understand the electrostatic discharge protection device of another exemplary embodiment, please refer to FIG. 9, FIG. 10, and FIG. 11. FIG. 9 is a layout diagram of an electrostatic discharge protection device according to another exemplary embodiment of the present disclosure. FIG. 10 is a cross-sectional diagram along the line DD of an electrostatic discharge protection device according to another exemplary embodiment of the present disclosure. FIG. 11 is a circuit diagram of an electrostatic discharge protection device according to another exemplary embodiment of the present disclosure.

As shown in FIG. 9 and FIG. 10, the present electrostatic discharge protection device with the silicon controlled rectifier path (i.e. embedded clamping circuit) comprises a substrate (not shown), a P-well 11, 21, a N-well 12, 22 and an isolation portion 101, 102, 105. Along the vertical direction, the P-well 11, N-well 12, P-well 21 and N-well 22 are formed in the substrate sequentially. Namely, the P-well 11 is neighboring to the N-well 12, the N-well 12 is neighboring to the P-well 21, and the P-well 21 is neighboring to the N-well 22. The relative locations of the N-type high doping regions 1101, 1103, 1105, 1207, 1209, the P-type high doping regions, and the isolation portion 101 have been explained in the exemplary embodiment of FIG. 5 and FIG. 6, thus omitting the redundant descriptions.

Please still refer to FIG. 9 and FIG. 10, along the vertical direction (as along the line CC), the P-well 21 comprises the N-type high doping region 2111, the P-type high doping region 2112, the N-type high doping region 2113, the P-type high doping region 2114, and the N-type high doping region 2115 sequentially located thereon. Along the vertical direction, the N-well 22 comprises the P-type high doping region 2216, the N-type high doping region 2217, the P-type high doping region 2218, the N-type high doping region 2219, and the P-type high doping region 2220 sequentially located thereon.

Please still refer to FIG. 9 and FIG. 10, the N-type high doping region 2111, the P-type high doping region 2112, the P-type high doping region 2114, and the N-type doping region 2115 are coupled to the ground end GND2, and the ground end GND2 is coupled to the second low reference voltage (e.g., the second ground voltage). The P-type high doping region 2216, N-type high doping region 2217, N-type high doping region 2219, and the P-type high doping region 2220 are coupled to the voltage supply end VDD2, and the voltage supply end VDD2 is coupled to the second high reference voltage (e.g., the second supply voltage). The N-type high doping region 2113 and the P-type high doping region 2218 are coupled to the input/output end IO2, and the input/output end IO2 is coupled to the second input/output voltage.

The isolation portion 102 is formed between the N-type high doping region 2115 and the P-type high doping region 2216, so that the silicon controlled rectifier path 112 is formed between the P-type high doping region 2114 and the N-type high doping region 2217. The silicon controlled rectifier path 112 is another embedded clamping circuit of the electrostatic discharge protection device. When the input/output end IO2 encounters electrostatic discharge (positive voltage), the silicon controlled rectifier path 112 provides a low-resistance path to lower the voltage of the input/output end IO2 during electrostatic discharge. Thus, the damage of the inner chip of the electronic device can be prevented.

Furthermore, the isolation portion 105 is formed between the P-type high doping region 1210 and the N-type high doping region 2111, so that another silicon controlled rectifier path 113 is formed between the P-type high doping region 2112 and the N-type high doping region 1209. In brief, the electrostatic discharge protection device of the exemplary embodiment consists of two electrostatic discharge protection devices of FIG. 5 and FIG. 6. The people of the related arts can easily figure out that repeating the layout of the exemplary embodiments of FIG. 5 and FIG. 6 three times offers totally five silicon controlled rectifier (SCR) paths. Besides, the repeating times of the layout structures are not limited.

As shown in FIG. 9, the P-type high doping regions 2112 and 2114 can form a ring-shaped P-type high doping region in the present exemplary embodiment, and the ring-shaped P-type high doping region encircles the N-type high doping region 2113, but the present disclosure is not limited thereto. Furthermore, the N-type high doping regions 2217 and 2219 can also form a ring-shaped N-type high doping region, and the ring-shaped N-type high doping region encircles the P-type high doping region 2218, but the present disclosure is not limited thereto.

In the present exemplary embodiment, the isolation portion 102 forms in the N-well 21 and the P-well 22, and the isolation portion 105 forms between the P-well 12 and the N-well 2, but the present disclosure is not limited thereto. Besides, the isolation portion 102 is a strip-shaped insulation portion to absolutely isolate the N-type high doping region 2115 from the P-type high doping region 2216, and the isolation portion 105 is a strip-shaped insulation portion to absolutely isolate the N-type high doping region 2111 from the P-type high doping region 1210. However, the present disclosure is not limited thereto.

As shown in FIG. 11, the electrostatic discharge protection device of the present exemplary embodiment comprises the diodes 3, 3", 4, 4" and the silicon controlled rectifier paths 111-113, wherein the diodes 3, 4 and the silicon controlled rectifier path 111 have been illustrated in the descriptions related to FIG. 4, thus omitting the redundant descriptions. The anode of the diode 3' and the cathode of the diode 4' are coupled to the input/output end IO2, the cathode of the diode 3' and the anode of the diode 4' are respectively coupled to the voltage supply end VDD2 and the ground end GND2, and the two ends of the silicon controlled rectifier path 112 are respectively coupled to the voltage supply end VDD2 and the ground end GND2. Moreover, the two ends of the silicon controlled rectifier path 113 are respectively coupled to the voltage supply end VDD1 and the ground end GND2.

The silicon controlled rectifier path 111, 113 of the electrostatic discharge protection device is the embedded clamping circuits, so that being different from the traditional electrostatic discharge protection device, the electrostatic discharge protection device does not need extra plug-in clamping circuits. Furthermore, the electrostatic discharge protection device not only offers electrostatic discharge protection but also lowers the voltage of the input/output end IO1, IO2 during electrostatic discharge. Thus, the inner chip of the electronic device can avoid damage. Besides, the silicon controlled rectifier path 112 is also the embedded clamping circuit and can isolate different supply voltages. That is to say, the electrostatic discharge protection device of the present exemplary embodiment does not need the extra isolation portion and can isolate more than two different power sources.

[Another Exemplary Embodiment of the Electrostatic Discharge Protection Device]

Figure 12:
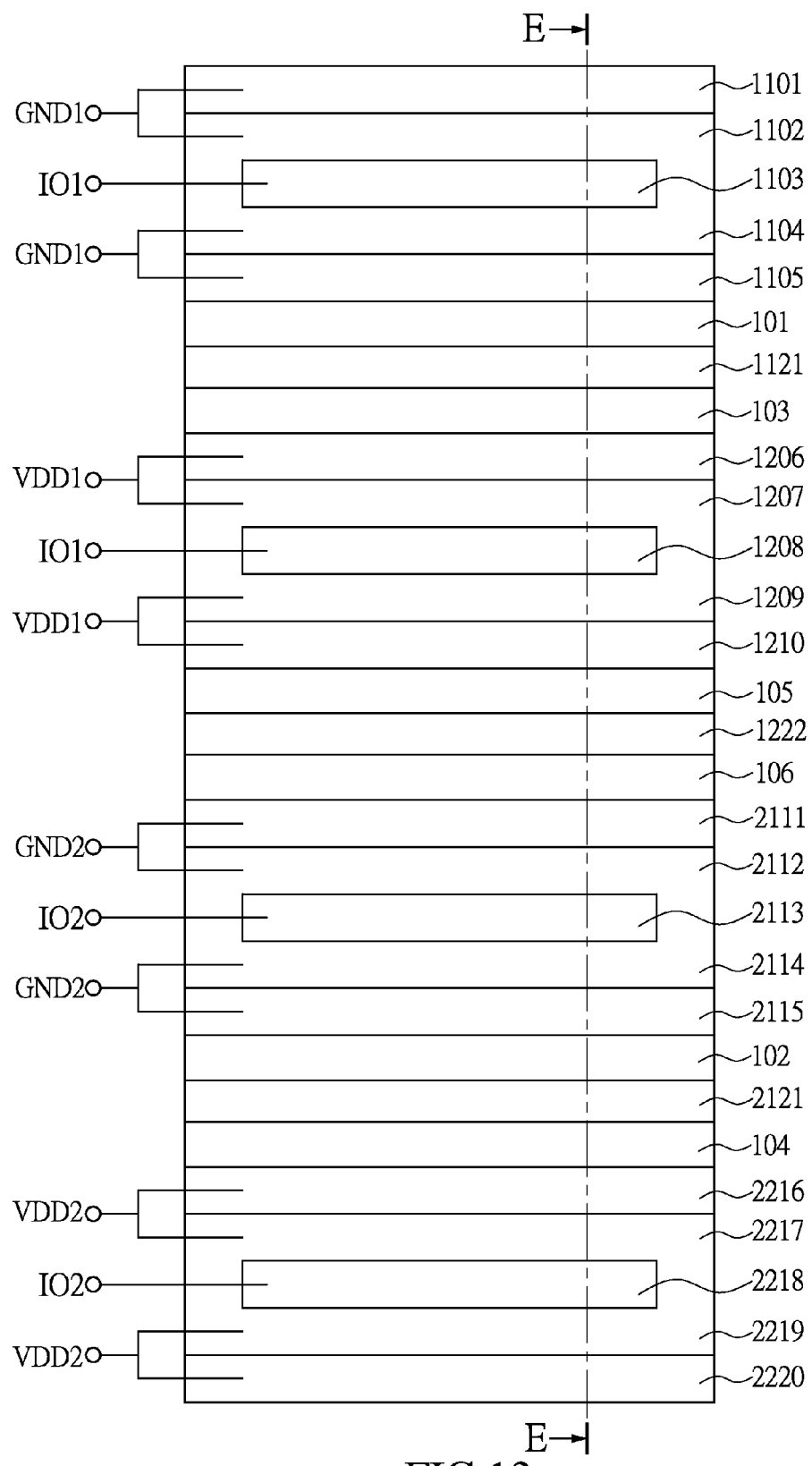
FIG. 12 is a layout diagram of an electrostatic discharge protection device according to another exemplary embodiment of the present disclosure.
Figure 13:
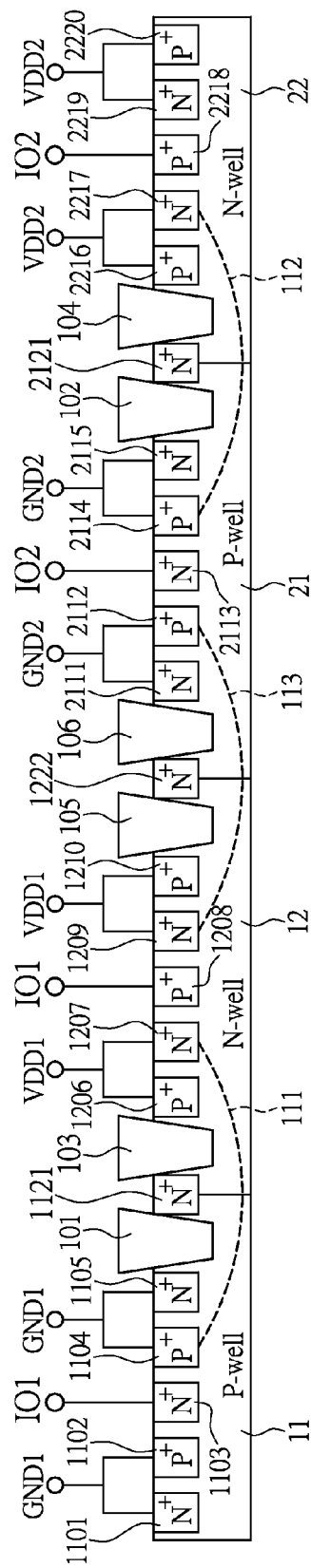
FIG. 13 is a cross-sectional diagram along the line EE of an electrostatic discharge protection device according to another exemplary embodiment of the present disclosure.

The following is another exemplary embodiment, please refer to FIG. 12 and FIG. 13 to further understand the present exemplary embodiment. FIG. 12 is a layout diagram of an electrostatic discharge protection device according to another exemplary embodiment of the present disclosure, and FIG. 13 is a cross-sectional diagram along the line EE of an electrostatic discharge protection device according to another exemplary embodiment of the present disclosure. The basic working principles of the exemplary embodiment are similar to those of FIG. 9 and FIG. 10. The following only explains the differences between the present exemplary embodiment and the exemplary embodiment of FIG. 9 and FIG. 10.

Being different from the electrostatic discharge protection device with embedded lateral silicon controlled rectifier in FIGS. 9 and 10, the electrostatic discharge protection device in FIG. 12 and FIG. 13 comprises an embedded modified lateral silicon controlled rectifier, but the present disclosure is not limited thereto. Thus the electrostatic discharge protection device of FIGS. 12 and 13 further comprises the isolation portions 103, 104, 106 and N-type high doping regions 1121, 1222, 2121 (can be replaced with P-type high doping regions in another exemplary embodiment), wherein the isolation portion 103 is formed between the N-type high doping region 1105 and the P-type high doping region 1206, the isolation portion 106 is formed between the P-type high doping region 1210 and the N-type high doping region 2111, and the isolation portion 104 is formed between the N-type high doping region 2115 and the P-type high doping region 2216.

The isolation portions 101 and 103 are respectively formed in the P-well 11 and the N-well 12; the N-type high doping region 1121 is formed in the P-well 11 and the N-well 12 and between the isolation portions 101, 103. The isolation portions 105 and 106 are respectively formed in the N-well 12 and the P-well 21, and the N-type high doping region 1222 is formed in the N-well 12 and the P-well 21 and between the isolation portions 105, 106. The isolation portions 102 and 104 are respectively formed in the P-well 21 and the N-well 22, and the N-type high doping region 2121 is formed in the P-well 21 and the N-well 22 and between the isolation portions 102 and 104.

Besides, the isolation portions 101 through 106 are strip-shaped insulation portions in this exemplary embodiment. Thus, the N-type high doping regions 1105 will be absolutely isolated from the 1112, and the N-type high doping region 1222 will be absolutely isolated from 2111. The N-type high doping region 2115 will be absolutely isolated from 2121, and the N-type high doping region 2121 will be absolutely isolated from the P-type high doping region 2216. However, the structure and shape of the isolation portions 101-106 are not used to limit the present disclosure.

In summary, the type of the embedded silicon controlled rectifier of the electrostatic discharge protection device is not limited in the present disclosure. In another exemplary embodiment, the embedded silicon controlled rectifier can also be embedded triggered silicon controlled rectifier. Correspondingly, there may be other isolation portions or high doping regions between the N-type high doping region 1105 and the P-type high doping region 1206, between the P-type high doping region 1210 and the N-type high doping region 2111, and between the N-type high doping region 2115 and the P-type high doping region 2216.

[Another Exemplary Embodiment of the Electrostatic Discharge Protection Device]

Figure 14:
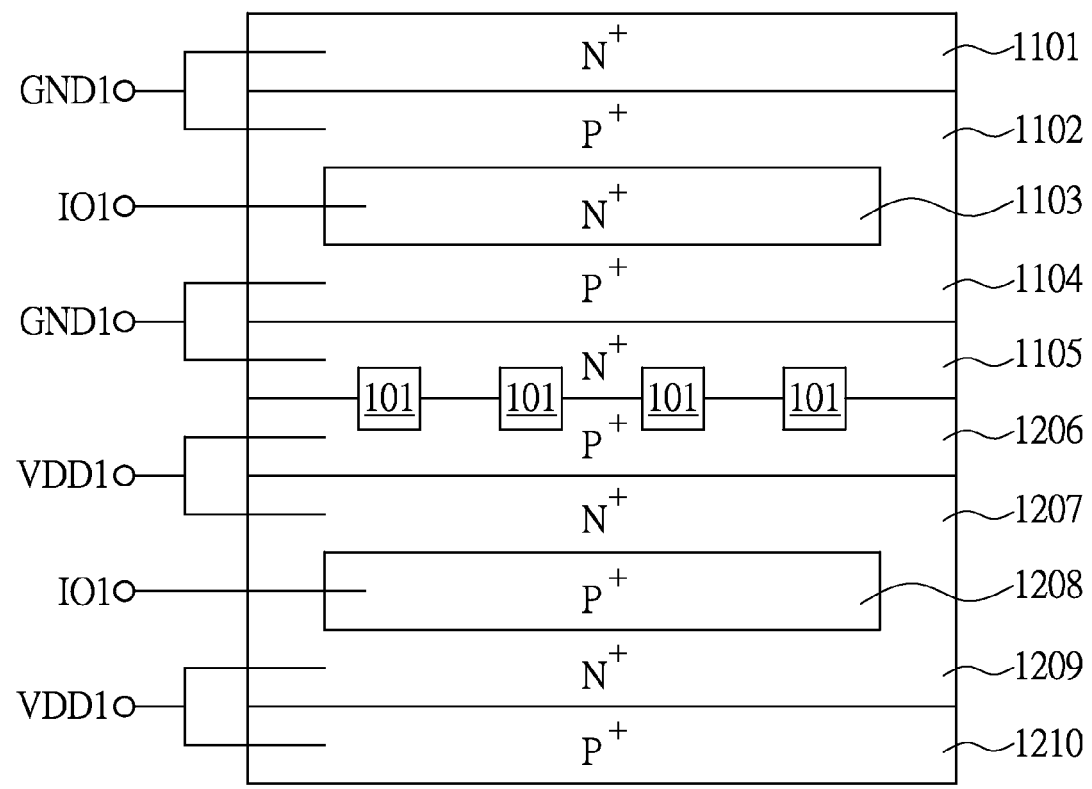
FIG. 14 is a layout diagram of an electrostatic discharge protection device according to another exemplary embodiment of the present disclosure.

Please refer to FIG. 14, FIG. 14 is a layout diagram of an electrostatic discharge protection device according to another exemplary embodiment of the present disclosure. The basic working principles of the exemplary embodiment are similar to those of FIG. 5 and FIG. 6. The following only explains the differences between the present exemplary embodiment and the exemplary embodiment of FIG. 5 and FIG. 6.

As shown in FIG. 14, the isolation portion 101 further comprises a plurality of insulation portions in this exemplary embodiment, wherein those insulation portions are formed in the N-well 11 and the P-well 12 with a distance between each other. The N-type high doping region 1105 is thus partially isolated from the P-type high doping region 1206. In brief, the embedded silicon controlled rectifier in this exemplary embodiment is also the lateral silicon controlled rectifier. The only differences between this embodiment and the embodiment of FIG. 5, 6 are the structures of the isolation portions 101.

[Another Exemplary Embodiment of the Electrostatic Discharge Protection Device]

Figure 15:
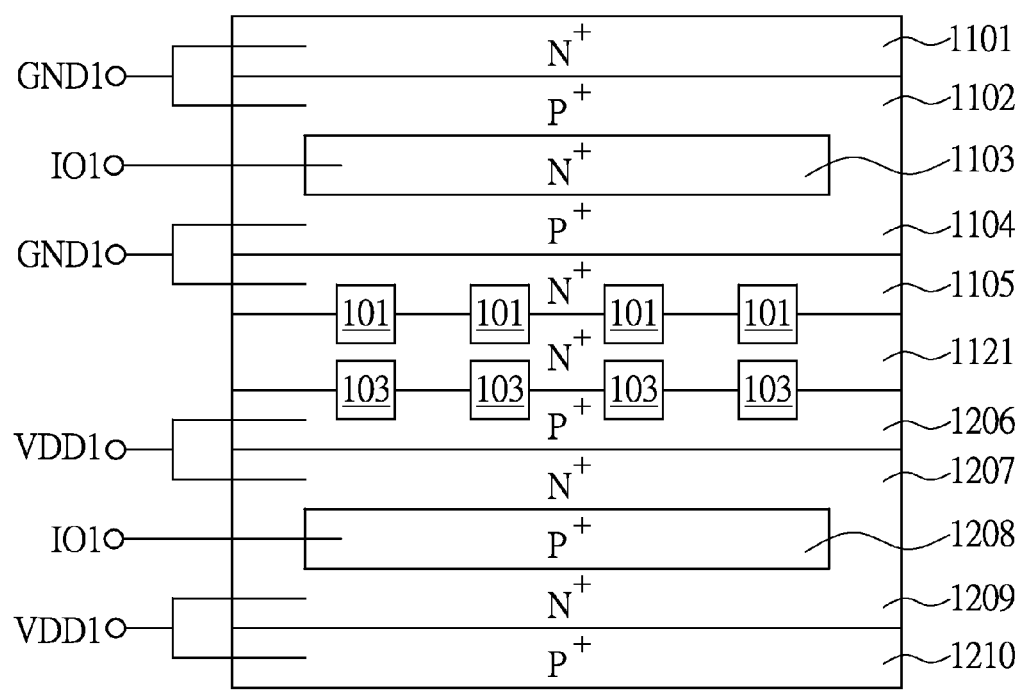
FIG. 15 is a layout diagram of an electrostatic discharge protection device according to another exemplary embodiment of the present disclosure.

Please refer to FIG. 15, FIG. 15 is a layout diagram of an electrostatic discharge protection device according to another exemplary embodiment of the present disclosure. The basic working principles of the exemplary embodiment are similar to those of FIG. 7 and FIG. 8. The following only explains the differences between the present exemplary embodiment and the exemplary embodiment of FIG. 7 and FIG. 8.

As shown in FIG. 15, the isolation portion 101 comprises a plurality of insulation portions, wherein the insulation portions are formed in the N-type high doping regions 1105 and 1121 with a distance between each other to partially isolate the N-type high doping region 1206 from the P-type high doping region 1121. In brief, the embedded silicon controlled rectifier of the exemplary embodiment is also the embedded modified lateral silicon controlled rectifier. The only differences between this exemplary embodiment and the exemplary embodiment of FIG. 7 and FIG. 8 are the structures of the isolation portions 101, 103.

[Another Exemplary Embodiment of the Electrostatic Discharge Protection Device]

Figure 16:
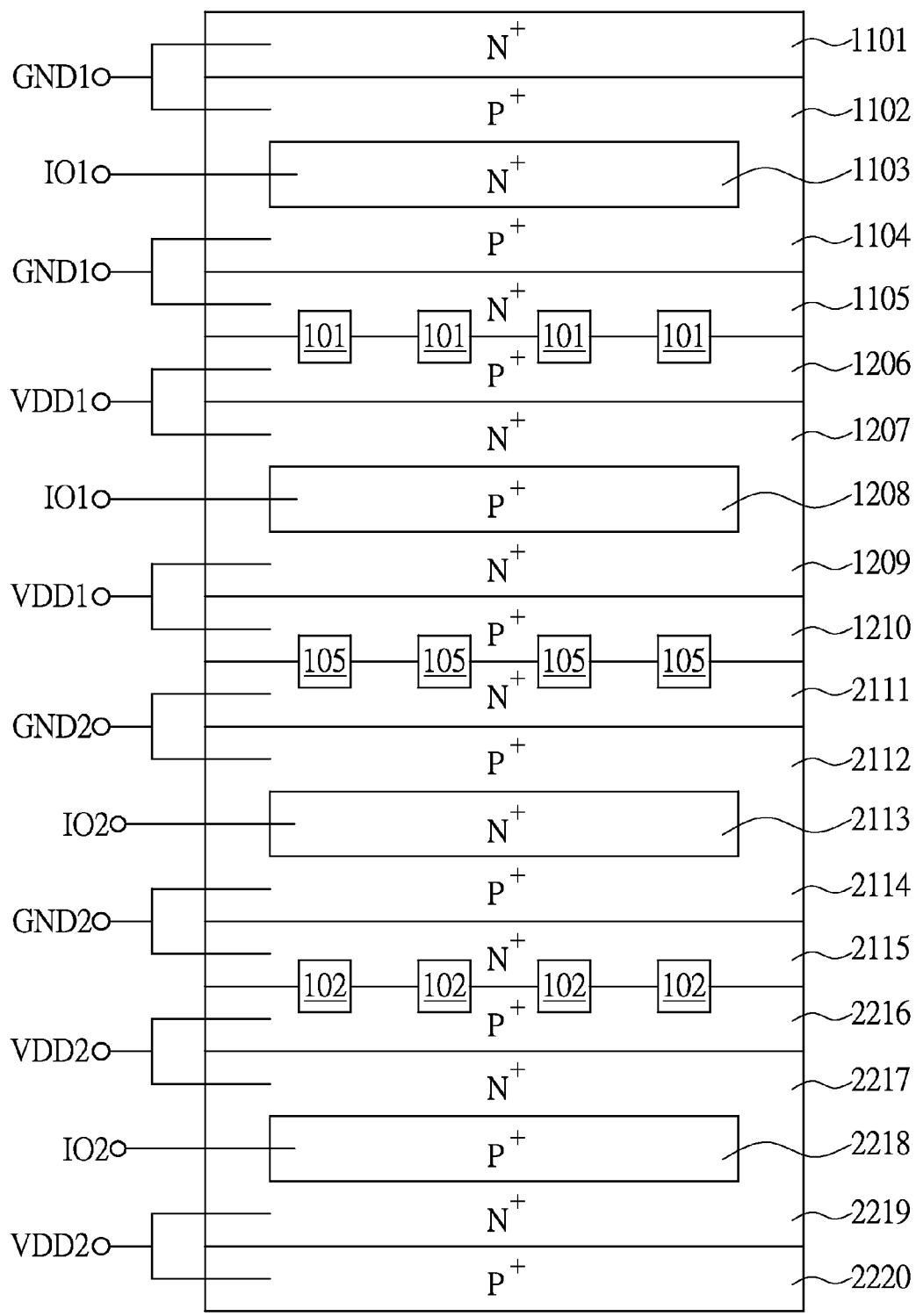
FIG. 16 is a layout diagram of an electrostatic discharge protection device according to another exemplary embodiment of the present disclosure.

Please refer to FIG. 16, FIG. 16 is a layout diagram of an electrostatic discharge protection device according to another exemplary embodiment of the present disclosure. The basic working principles of the exemplary embodiment are similar to those of FIG. 9 and FIG. 10. The following only explains the differences between the present exemplary embodiment and the exemplary embodiment of FIG. 9 and FIG. 10.

As shown in FIG. 16, the isolation portion 101 further comprises a plurality of insulation portions in this exemplary embodiment, wherein these insulation portions are formed in the N-well 11 and the P-well 12 with a distance between each other to partially isolate the N-type high doping region 1105 from the P-type high doping region 1206. The isolation portion 105 further comprises a plurality of insulation portions, wherein these insulation portions are formed in the P-well 12 and the N-well 11 with a distance between each other to partially isolate the P-type high doping region 1210 from the N-type high doping region 2111. The isolation portion 102 further comprises a plurality of insulation portions, wherein these insulation portions are formed in the N-well 21 and the P-well 22 with a distance between each other to partially isolate the N-type high doping region 2115 from the P-type high doping region 2216. In brief, the embedded silicon controlled rectifier of this exemplary embodiment is also the lateral embedded silicon controlled rectifier. The only differences between this exemplary embodiment and the exemplary embodiment of FIG. 9 and FIG. 10 are the structures of the isolation portions 101, 102, and 105.

[Another Exemplary Embodiment of the Electrostatic Discharge Protection Device]

Figure 17:
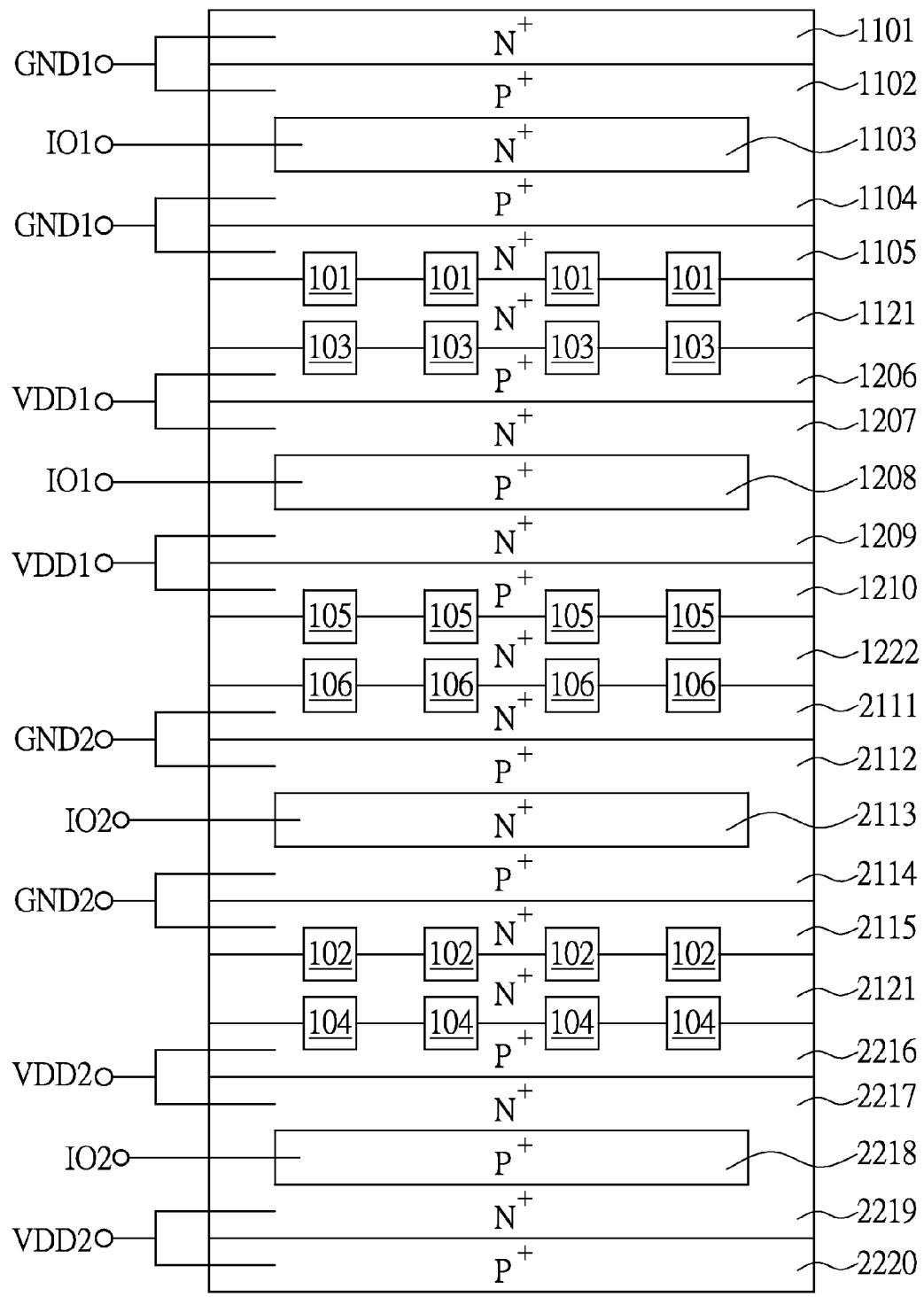
FIG. 17 is a layout diagram of an electrostatic discharge protection device according to another exemplary embodiment of the present disclosure.

Please refer to FIG. 17, FIG. 17 is a layout diagram of an electrostatic discharge protection device according to another exemplary embodiment of the present disclosure. The basic working principles of the exemplary embodiment are similar to those of FIG. 12 and FIG. 13. The following only explains the differences between the present exemplary embodiment and the exemplary embodiment of FIG. 12 and FIG. 13.

As shown in FIG. 17, the isolation portion 101 in this exemplary embodiment comprises a plurality of insulation portions, wherein these insulation portions are formed in the N-type high doping region 1105 and 1121 with a distance between each other to partially isolate the N-type high doping region 1105 from 1121. Similarly, the isolation portion 103 also comprises a plurality of insulation portions, wherein these insulation portions are formed in the N-type high doping region 1121 and the P-type high doping region 1206 with a distance between each other to partially isolate the N-type high doping region 1121 from the P-type high doping region 1206.

The isolation 105 comprises a plurality of insulation portions, wherein these insulation portions are formed in the P-type high doping region 1210 and the N-type high doping region 1222 with a distance between each other to partially isolate the P-type high doping region 1210 from the N-type high doping region 1222. Similarly, the isolation portion 106 also comprises a plurality of insulation portions, wherein these insulation portions are formed in the N-type high doping regions 1222 and 2111 with a distance between each other to partially isolate the N-type high doping region from 2111.

The isolation portion 102 comprises a plurality of insulation portions, wherein these insulation portions are formed in the N-type high doping regions 2115 and 2121 with a distance between each other to partially isolate the N-type high doping region 2115 from the N-type high doping region 2121. Similarly, the isolation portion 104 also comprises a plurality of insulation portions, wherein these insulation portions are formed in the N-type high doping region 211 and the P-type high doping region 2216 with a distance between each other to partially isolate the N-type high doping region 2121 from the P-type high doping region 2216. In brief, the embedded silicon controlled rectifier in this exemplary embodiment is also the modified embedded lateral silicon controlled rectifier. The only differences between this exemplary embodiment and the exemplary embodiment of FIG. 12, 13 are the structures of the isolation portions 101 through 106.

[One Exemplary Embodiment of the Electrostatic Discharge Protection Device]

Figure 18:
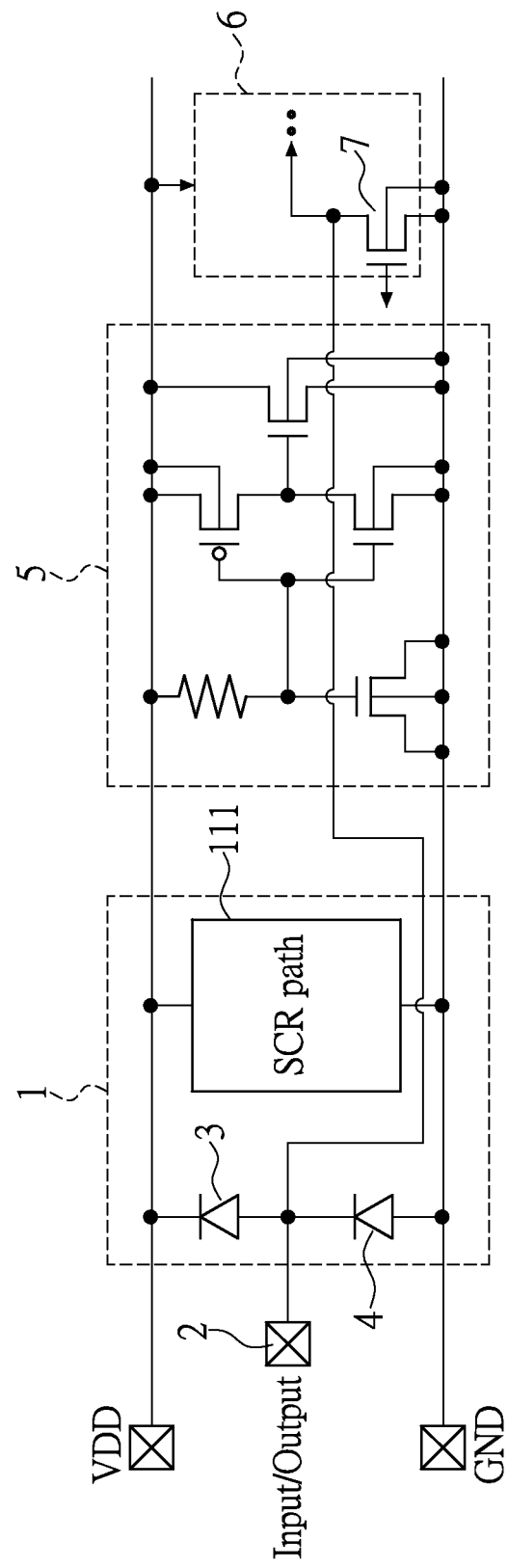
FIG. 18 is a circuit diagram of an electronic device according to an exemplary embodiment of the present disclosure.

Please refer to FIG. 18, FIG. 18 is a circuit diagram of an electronic device according to an exemplary embodiment of the present disclosure. As shown in FIG. 18, the electronic device comprises an input/output end 2, a voltage supply end VDD, a ground end GND, an electrostatic discharge protection device 1, and a chip 6, wherein the electrostatic discharge protection device can be any one of the electrostatic discharge protection devices of the exemplary embodiments.

The electrostatic discharge protection device comprises the diodes 3, 4 and the embedded silicon controlled rectifier path 111. The anode of the diode 3 and the cathode of the diode 4 are coupled to the input/output end IO1, the cathode of the diode 3 and the anode of the diode 4 are respectively coupled to the voltage supply end VDD1 and the ground end GND1. The two ends of the silicon controlled rectifier path 111 are respectively coupled to the voltage supply end VDD1 and the ground end GND1. The chip 6 is coupled to the voltage supply end VDD, the input/output end 2, the ground end GND, and is equivalent to the combination of a plurality of transistors. The ground end GND is coupled to the ground voltage, the voltage supply end is coupled to the supply voltage, wherein the supply voltage is larger than the ground voltage.

Besides, the electronic device can further comprise a plug-in clamping circuit 5 to further lower the voltage of the input/output end 2 during electrostatic discharge, wherein the clamping circuit 5 is coupled to the voltage supply end VDD and the ground end GND.

THE POSSIBLE EFFECTS OF THE EXEMPLARY EMBODIMENT

The exemplary embodiment of the present disclosure adopts the special layout structure, so that the electrostatic discharge protection device has embedded clamping circuit to form the silicon controlled rectifier path. The mentioned embedded clamping circuit can effectively control the voltage of the input/output end coupled to the electrostatic discharge protection device, thus preventing the problem of breakdown of the inner chip caused by the high voltage of the input/output end.

Furthermore, the above mentioned special layout structure can be repeated and modified, thus the electrostatic discharge protection device comprises a plurality of embedded silicon controlled rectifier paths. In summary, being different from the traditional electrostatic discharge protection device, the present electrostatic discharge protection device has the advantages of low cost, better electrostatic protection effect, and better combination flexibility.

The above-mentioned descriptions represent merely the exemplary embodiment of the present disclosure, without any intention to limit the scope of the present disclosure thereto. Various equivalent changes, alternations or modifications based on the claims of present disclosure are all consequently viewed as being embraced by the scope of the present disclosure.

What is claimed is:

1. An electrostatic discharge protection device, comprising:
   a substrate;
   a first P-well, formed in the substrate, wherein along a specific direction, the P-well has a first N-type high doping region, a first P-type high doping region, a second N-type high doping region, a second P-type high doping region, and a third N-type high doping regions sequentially located thereon, and the first, third N-type high doping regions and the first, second P-type doping regions are connected to a first ground end; and
   a first N-well, formed in the substrate, neighboring to the first P-well, wherein along the specific direction, the N-well has a third P-type high doping region, a fourth N-type high doping region, a fourth P-type high doping region, a fifth N-type high doping region, and a fifth P-type high doping regions sequentially located thereon, and the third, fifth P-type high doping regions and the fourth, fifth N-type high doping regions are coupled to a first voltage supply end, and the second N-type high doping region, the fourth P-type high doping region are coupled to the first input/output end.

2. The electrostatic discharge protection device according to claim 1, further comprising:
   a second P-well, formed in the substrate, neighboring to the first N-well, wherein along the specific direction, the second P-well has a sixth N-type high doping region, a sixth P-type high doping region, a seventh N-type high doping region, a seventh P-type high doping region, and a eighth N-type high doping regions sequentially located thereon, and the sixth, eighth N-type high doping regions and the sixth, seventh P-type high doping regions are coupled to a second ground end;
   and a second N-well, formed in the substrate, neighboring to the second P-well, wherein along the specific direction, the second N-well has a eighth P-type high doping region, a ninth N-type high doping region, a ninth P-type high doping region, a tenth N-type high doping region, and a tenth P-type high doping region sequentially located thereon, the eighth, tenth P-type high doping regions and the ninth, tenth N-type high doping region are coupled to the second voltage supply end, and the seventh N-type high doping region and the ninth P-type high doping region are coupled to a second input/output end.

3. The electrostatic discharge protection device according to claim 2, wherein a first silicon controlled rectifier path is formed between the second P-type high doping region and the fourth N-type high doping region, a second silicon controlled rectifier path is formed between the fifth N-type high doping region and the sixth P-type high doping region, and a third silicon controlled rectifier path is formed between the seventh P-type high doping region and the ninth N-type high doping region.

4. The electrostatic discharge protection device according to claim 2, further comprising:
   a second isolation portion formed between the fifth P-type high doping region and the sixth N-type high doping region; and
   a third isolation portion formed between the eighth N-type high doping region and the eighth P-type high doping region.

5. The electrostatic discharge protection device according to claim 1, wherein a first silicon controlled rectifier path is formed between the second P-type high doping region and the fourth N-type high doping region.

6. The electrostatic discharge protection device according to claim 1, further comprising a first isolation portion formed between the third N-type high doping region and the third P-type high doping region.

7. The electrostatic discharge protection device according to claim 6, wherein the first isolation portion is formed in the first N-well and the first P-well, and the first isolation portion is a strip-shaped insulation portion to absolutely the third N-type high doping region from the third P-type high doping region.

8. The electrostatic discharge protection device according to claim 6, further comprising:
- a second isolation portion formed between the third N-type high doping region and the third P-type high doping region, wherein the first isolation portion and the second isolation portion are respectively formed in the first P-well and the first N-well; and
- a high doping region formed in the first P-well and the first N-well and between the first isolation portion and the second insulation portion.

9. The electrostatic discharge protection device according to claim 8, wherein the first isolation portion is a strip-shaped insulation portion to absolutely the third N-type high doping region from the high doping region, and the second isolation portion is another strip-shaped insulation portion to absolutely the third P-type high doping region from the high doping region.

10. The electrostatic discharge protection device according to claim 1, wherein the first P-type high doping region and the second P-type high doping region forms a ring-shaped P-type high doping region encircling the second N-type high doping region, and the fourth N-type high doping region and the fifth N-type high doping region forms a ring-shaped N-type high doping region encircling the fourth P-type high doping region.

11. An electronic device, comprising:
a chip; and
an electrostatic discharge protection device, comprising:
- a substrate;
- a first P-well, formed in the substrate, wherein along a specific direction, the P-well has a first N-type high doping region, a first P-type high doping region, a second N-type high doping region, a second P-type high doping region, and a third N-type high doping regions sequentially located thereon, and the first, third N-type high doping regions and the first, second P-type doping regions are connected to a first ground end; and
- a first N-well, formed in the substrate, neighboring to the first P-well, wherein along the specific direction, the N-well has a third P-type high doping region, a fourth N-type high doping region, a fourth P-type high doping region, a fifth N-type high doping region, and a fifth P-type high doping regions sequentially located thereon, and the third, fifth P-type high doping regions and the fourth, fifth N-type high doping regions are coupled to a first voltage supply end, and the second N-type high doping region, the fourth P-type high doping region are coupled to the first input/output end.

\* \* \* \* \*